United States Patent [19]

Bran

[11] Patent Number: 5,534,076

[45] Date of Patent: Jul. 9, 1996

[54] MEGASONIC CLEANING SYSTEM

[75] Inventor: Mario E. Bran, Garden Grove, Calif.

[73] Assignee: Verteq, Inc., Santa Ana, Calif.

[21] Appl. No.: 316,940

[22] Filed: Oct. 3, 1994

[51] Int. Cl.$^6$ ..................................................... B08B 3/12
[52] U.S. Cl. ................................................ 134/1; 134/184
[58] Field of Search ............................... 134/1, 105, 184,
134/902

[56] References Cited

U.S. PATENT DOCUMENTS

| | | | |
|---|---|---|---|
| 2,498,737 | 2/1950 | Holden | 134/184 |
| 2,760,501 | 8/1956 | Gander | 134/184 |
| 2,802,476 | 8/1957 | Kearney | 134/184 |
| 2,814,575 | 11/1957 | Lange, Jr. | 134/184 |
| 2,934,661 | 4/1960 | Chambers | 134/184 |
| 2,950,725 | 8/1960 | Jacke et al. | 134/184 |
| 3,077,155 | 2/1963 | Maddock et al. | 134/184 |
| 3,401,708 | 9/1968 | Henes | 134/184 |
| 3,596,883 | 8/1971 | Brech | 134/184 |
| 3,700,937 | 10/1972 | Rissolo | 310/341 |
| 3,972,018 | 7/1976 | Erickson | 310/337 |
| 4,183,011 | 1/1980 | Massa | 134/184 |
| 4,543,130 | 9/1985 | Shwartzman | 134/1 |
| 4,565,942 | 1/1986 | Sakai et al. | 310/338 |
| 4,635,666 | 1/1987 | Daley et al. | 134/172 |
| 4,694,527 | 9/1987 | Yoshizawa | 15/308 |
| 4,804,007 | 2/1989 | Bran | 134/184 |
| 4,823,041 | 4/1989 | Inoue et al. | 310/322 |
| 4,841,581 | 6/1989 | Russell | 4/400 |
| 4,869,278 | 9/1989 | Bran | 134/184 |
| 4,902,350 | 2/1990 | Steck | 134/1 |
| 4,905,325 | 3/1990 | Colditz | 4/321 |
| 4,917,123 | 4/1990 | McConnell et al. | 134/95 |
| 4,934,392 | 6/1990 | Henfrey | 134/61 |
| 4,971,920 | 11/1990 | Miyashita et al. | 134/1 |
| 4,980,300 | 12/1990 | Miyashita et al. | 134/1 |
| 4,997,490 | 3/1991 | Vetter et al. | 134/26 |
| 4,998,549 | 3/1991 | Bran | 134/184 |
| 5,037,481 | 8/1991 | Bran | 134/1 |
| 5,071,776 | 12/1991 | Matsushita et al. | 134/1 |
| 5,078,801 | 1/1992 | Malik | 134/29 |
| 5,090,432 | 2/1992 | Bran | 134/1 |
| 5,247,954 | 9/1993 | Grant et al. | 134/184 |
| 5,279,316 | 1/1994 | Miranda | 134/1 |
| 5,286,657 | 2/1994 | Bran | 134/1 |
| 5,365,960 | 11/1994 | Bran | 134/184 |

FOREIGN PATENT DOCUMENTS

| | | |
|---|---|---|
| 209164 | 2/1956 | Australia . |
| 319806 | 11/1988 | European Pat. Off. . |
| 3212916 | 10/1983 | Germany . |
| 54-69260 | 4/1979 | Japan . |
| 281431 | 12/1987 | Japan . |
| 63-36534 | 2/1988 | Japan . |
| 118229 | 1/1989 | Japan . |
| 246835 | 10/1989 | Japan . |
| 304733 | 12/1989 | Japan . |
| 316935 | 12/1989 | Japan . |
| 801670 | 9/1958 | United Kingdom . |

Primary Examiner—Scott Kastler
Attorney, Agent, or Firm—Knobbe, Martens, Olson & Bear

[57] ABSTRACT

A transducer is bonded to a metal carrier that is mounted on an elastomeric frame-like diaphragm. The outer periphery of the diaphragm is mounted on a frame bonded to the bottom of a quartz tank. A vacuum applied to a chamber surrounding the lower portion of the carrier draws the carrier against the tank bottom with a compliant interface between the tank and the carrier. A cover clamps the diaphragm to the support and creates a coolant chamber with the diaphragm and the carrier for cooling the transducer. In other arrangements, resilient material or springs are employed to produce a force to compress the interface against the tank. Also the weight of the tank can produce compressive force on the interface.

49 Claims, 7 Drawing Sheets

MEGASONIC CLEANING SYSTEM

FIELD OF THE INVENTION

This invention relates to systems for cleaning components such as semiconductor substrates or other such items requiring extremely high levels of cleanliness.

BACKGROUND OF THE INVENTION

U.S. Pat. No. 3,893,869 discloses a cleaning system wherein very high frequency energy is employed to agitate a cleaning solution to loosen particles on the surfaces of semiconductor substrates or wafers. Maximum cleanliness for such items is desired in order to improve the yield of acceptable semiconductor chips made from such wafers. This cleaning system has become known as megasonic cleaning, in contrast to ultrasonic cleaning in view of the high frequency energy employed. Megasonic cleaning has a number of known advantages over ultrasonic cleaning.

One of the major improvements that help make the product a commercial reality concerns the design of the transducer array which converts electrical energy into sound waves for agitating the cleaning liquid. The transducer array is perhaps the most critical component of the megasonic cleaning system. A transducer array which was marketed for a number of years by Verteq, Inc., of Santa Ana, Calif., utilized a transducer array mounted in the bottom of a process tank. The array included a strong, rigid frame with a very thin foil layer of tantalum, which is a ductile acid-resisting metallic element, spread over the upper surface of the frame. Ceramic transducers were positioned within a space in the plastic frame and bonded to the lower side of the tantalum layer. The frame was then attached to the bottom wall of the container with the tantalum being exposed to the interior of the container.

In later improvements, the tantalum foil was replaced by quartz as a transmitter, which has provided a number of advantages. Such arrangements are shown in U.S. Pat. Nos. 4,804,007, 4,998,549 and 5,037,481. The use of quartz as the material that transmits the megasonic energy into the tank has also led to the mounting of the megasonic energy transducer directly to the wall of a quartz tank. There are, however, a number of drawbacks and complexities with that approach. In initially installing a transducer, there is always the risk of damage to the tank, and tanks are relatively expensive. Further, if the end user of the apparatus does not have the capability for servicing or installing the transducer array, it is necessary to ship the entire tank to the entity that will provide such service. This means that the tank is out of commission for the time required to ship and service the unit, and this adds to the expense of the process. Further, if the portion of the container which is to serve as the transducer is curved rather than flat, the initial expense and the expense of delay are increased.

Because of these complexities, another approach that has been used is to form the transducer array as a separate unit mounted on a frame and then to attach the frame to a tank wall with the transmitter extending through a hole in the tank wall. An advantage of this approach is that the transducer array can be completely assembled and then mounted as a unit on the tank, and hence can be serviced and replaced more simply than if the entire tank has to be shipped or otherwise handled. On the other hand, there are also drawbacks to this technique. A primary drawback is that fasteners and seals are required to hold the various components together and to prevent leakage of fluids. This normally means that seals or other connecting components are exposed to the cleaning solutions to be placed in the tanks, and this in turn introduces compatibility and cleanliness issues. Also, there are connection difficulties in that fasteners cannot normally be threaded into quartz with sufficient strength or durability. Thus, typically the tank is made of plastic rather than quartz. While there are some excellent plastics available, quartz is preferable from a cleanliness standpoint. As cleanliness requirements become more stringent, the demand for quartz tanks has increased.

In view of the foregoing, a need exists for an improved system for mounting a transducer array to a quartz tank. Desirably, the improved technique will overcome the shortcomings of prior arrangements, but will maintain the advantages of the known arrangements.

SUMMARY OF THE INVENTION

Briefly stated, the improved cleaning apparatus includes a tank, preferably made of quartz, having a megasonic energy transmitter formed integrally with a wall of the tank, preferably the bottom wall. The transmitter may be simply a flat section of the bottom wall or in a curved shape, such as a semi-cylindrical shell (i.e., a half-cylinder) wherein a convex surface of the shell protrudes into the tank and a concave surface of the shell forms an exterior surface of the tank. The use of a half-cylindrical shell allows the use of greater power density for a given width of tank bottom, because a greater area of transducer may be placed within a given width. In a preferred arrangement, a rigid support frame is bonded to the exterior surface of the tank bottom wall surrounding the area of the bottom wall in which the megasonic transmitter section is located.

A shell-like carrier provides a mounting for a transducer. More specifically, the carrier has a surface on one side which conforms to the transmitter surface on the tank, and has a similar exterior surface. The carrier is preferably made of aluminum or other material which is a good transmitter of megasonic energy, is relatively strong and lightweight, and is a good thermal conductor. One or more transducers are mounted to the interior of the carrier. An interface layer is positioned on the upper surface of the aluminum carrier. The carrier assembly is moved into close proximity to the corresponding quartz transmitter with the interface layer being sandwiched between the aluminum carrier and the quartz transmitter. The carrier is preferably mounted on the inner periphery of a frame made of elastomeric or other flexible material. The exterior of the elastomeric frame is attached to the support frame. The components are dimensioned such that the aluminum carrier is thus flexibly supported by the elastomeric frame, in close proximity to the quartz transmitter.

In one arrangement, surrounding a lower portion of the carrier is a chamber formed by the carrier, the tank bottom and the frames. The connections between the components are pneumatically sealed so that a vacuum can be applied to the chamber. The vacuum causes the carrier to be drawn towards the quartz transmitter compressing the interface between the carrier and the quartz transmitter so that megasonic energy is efficiently transmitted through the carrier, the interface, the quartz layer and into the tank. Advantageously, there is no stress on the quartz transmitter since the force on the carrier caused by the vacuum is balanced by a force on the quartz exerted by the vacuum as well. The other major benefit of the arrangement is that there is no need for gaskets being exposed to the cleaning solutions in the tank. At the same time, however, the carrier, together with the transducer and the elastomeric frame, can be readily removed from the rigid support frame and replaced or serviced, without disturbing the tank.

Another feature of the invention is that a cover may be secured to the support frame to create a cooling chamber to which coolant may be conducted in contact with the lower portion of the carrier. Again, the thermal conductivity of the carrier will assist in drawing heat away from the transducer. Further, a partition may be attached to the exterior of the carrier to separate the cooling chamber from a purge gas chamber surrounding the transducer. As a variation of the cooling arrangement, coolant passages may be formed in a lower portion of the carrier to withdraw heat from the transducer. If the tank wall transmitter is sufficiently strong, the carrier may be held in position by spring or other resilient elements.

A further aspect of the invention is the method of making the apparatus as outlined above. The invention also incorporates a method of transmitting sonic energy into the tank with the above-described apparatus. The device is assembled as stated above, and the transducer is energized to induce megasonic radiation through the carrier and the quartz tank and into the tank.

DETAILED DESCRIPTION OF THE PREFERRED EMBODIMENTS

Figure 1:
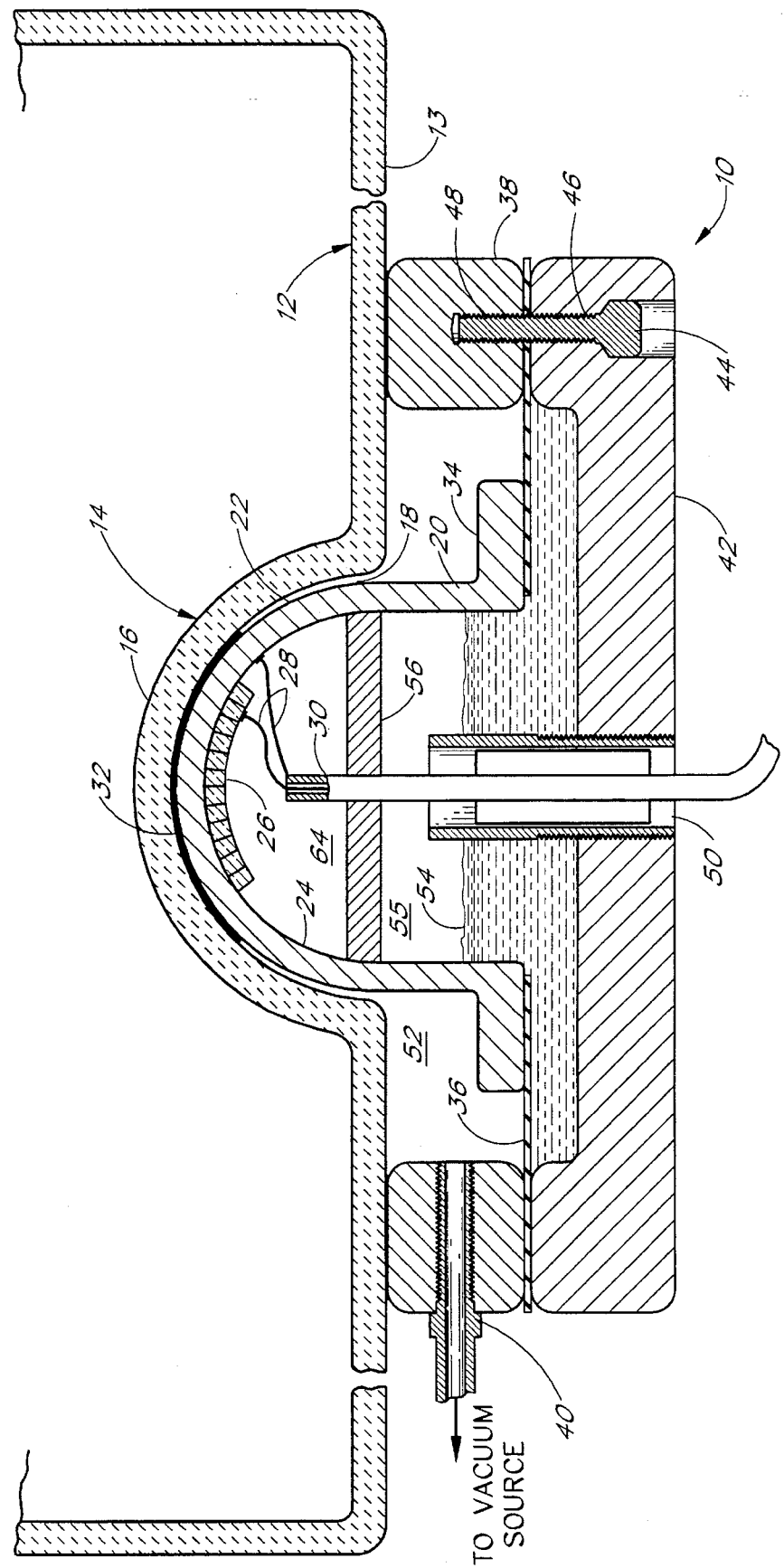
FIG. 1 is a cross section of a megasonic cleaning apparatus of the present invention taken in a direction perpendicular to the axis of the half-cylindrical bottom of the tank.

Referring to the drawings, FIG. 1 illustrates a megasonic cleaning apparatus 10 including a tank 12 typically containing a cleaning solution and a plurality of semiconductor wafers (not shown) which are to be cleaned. In one embodiment, the tank 12 is preferably provided with a half-cylindrical shell 14 projecting upward in the bottom wall. Because it is cylindrical, the shell 14 forms a convex interior surface 16 and a concave exterior surface 18. Flat end walls 15 close the shell ends and are joined to the adjacent bottom wall.

A carrier 20, positioned on the exterior surface 18 of the tank, has a convex exterior surface 22 and a concave interior surface 24. As can be seen, the main upper portion of the carrier has a half-cylindrical shape which fits within the tank shell 14 and has closed end walls 21. The carrier further has lower flanges or legs 34 that extend around the periphery of the carrier. The carrier 20 is preferably constructed of thin, but stiff, lightweight material, such as aluminum, because of its superior acoustical and thermal conductivity, although other materials may be used. Coupled to the carrier's lower surface 24 is one or more arcuate piezoelectric transducers 26, which generate megasonic energy that is radiated into the tank to clean semiconductor wafers. The transducer is energized by wires 28 from a cable 30, which is connected to an external source of radio-frequency electrical energy. The transducer 26 is preferably bonded to the tube by a suitable heat and electrically conductive epoxy so that the transducer 26 will propagate energy into the adjacent section of the carrier, and heat generated by the transducer 26 will be transferred to the carrier 20. One suitable epoxy is sold in sheet form by Ablestick of Gardena, Calif., and is identified as ECF 550.

An interface 32 is preferably sandwiched between the exterior surface 22 of the carrier 20 and the exterior surface 18 of the tank 12. The interface 32 is adapted to transmit the sonic energy emitted by the transducer 26 from the carrier 20 to the shell 14 by providing good contact between these components. The interface is preferably fabricated from fabric or fiberglass cloth and may be saturated with a suitable vacuum pump oil to conform to the compressing components. The oil used in a successful prototype of the system was purchased from Pfeiffer, a division of Balzer's and is identified as 0LP3. If necessary, a supply of oil for the interface 32 may be assured by partially filling the space beneath the walls of the tank 12 with oil, into which a wick (not shown) may be extended from the interface 32. Materials may be available that do not require oil to be a good transmitter. As shown in FIG. 1, the interface 32 need only extend a short distance beyond each end of the transducer 26.

The carrier flange 34 is connected to the inner periphery of a frame-shaped, planar, flexible diaphragm 36, which is made from a suitably elastic material such as rubber or an elastomer. The diaphragm 36 is sufficiently strong to support the lightweight carrier 20. The diaphragm is supported by a rigid rectangular support frame 38, which is mounted to the exterior surface of the tank 12. The frame is spaced outwardly from, but generally coextensive with, the shell 16 and carrier 20. It is constructed of a suitable material such as plastic and bonded to the exterior of the tank 12 by a suitable sealant such as silicon RTV (room temperature vulcanizing). One sealant that has been found to be effective is that sold by Locktite and identified as V-612 with primer V-06. The bond between the frame 38 and the tank 12 is gas tight and is capable of holding a vacuum between the frame and the exterior of the tank, while minimizing stress on the tank. A vacuum line 40 connects the interior of the frame 38 with an external vacuum source (not shown).

A cover 42 is preferably mounted over the support frame 38. The cover, made of a suitable material such as plastic, clamps the diaphragm 36 to the frame 38 by screws 44 that are inserted through holes 46 in the cover and threaded into holes in the frame. The cover includes a passage 50, through which the cable 30 driving the transducer 26 extends.

The exterior wall of the tank 12, together with the diaphragm 36, the outer surface 22 of the carrier 20, and the inner walls of the support frame 38, form a chamber 52 which is pneumatically sealed (i.e. gas tight) and is capable of holding a vacuum applied by removing air through the vacuum passage 40. During operation of the megasonic cleaner, a vacuum source is connected to the vacuum passage 40 and the chamber 52 is evacuated. Because the space between the diaphragm 36 and the cover 42 and the inside of the carrier 20 is not evacuated, a pressure differential is created across the diaphragm 38. Since the pressure is greater in the space between the diaphragm 36 and cover 42 than between the diaphragm 36 and walls of the tank 12, the diaphragm is forced upwardly. Because the carrier 20 is mounted to the diaphragm 36, it is forced upwardly into engagement with the interface 32 and exterior wall 18 of the tank 12. It is this engagement which provides the needed mechanical coupling between the carrier 20 (on which is mounted the transducer 26), the interface 32, and the shell 14.

Securing the carrier 20 to the shell 14 by the use of a vacuum-induced pressure differential advantageously eliminates the stress that would otherwise be exerted on the shell 16 by the carrier 20. This is true since the same vacuum which urges the carrier 20 into contact with the shell exterior surface 18 also exerts a counter-directed (i.e. downward) stress force on the shell 14, because the pressure at the top surface 16 of the shell is greater than that at the bottom surface 18 by an amount equal to the pressure differential across the diaphragm 36. Consequently, the upwardly-directed force exerted by the carrier outer surface 22 substantially cancels the equal and oppositely-directed stress force exerted on the shell 14 by the vacuum-induced pressure differential between the top and bottom surfaces of the shell 14. This cancellation of stress forces on the quartz tank 12 is an important feature of the present invention, because it allows the walls of the tank to be made thinner than otherwise possible, thereby improving the transmissivity of the tank walls to megasonic energy and reducing the power and, consequently, the cooling requirements of the transducer 26.

Figure 2:
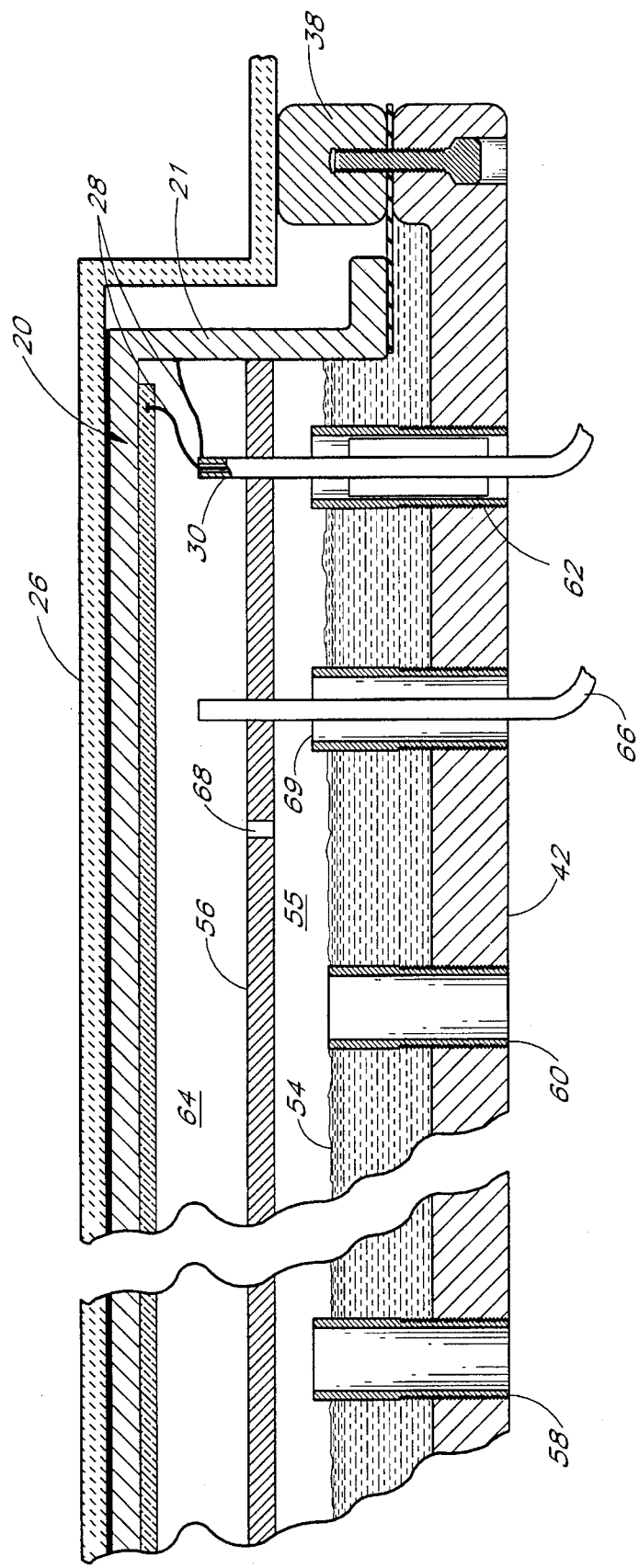
FIG. 2 is a cross section of a megasonic cleaning apparatus of the present invention taken in a direction along the axis of the half-cylindrical bottom of the tank.
Figure 3:
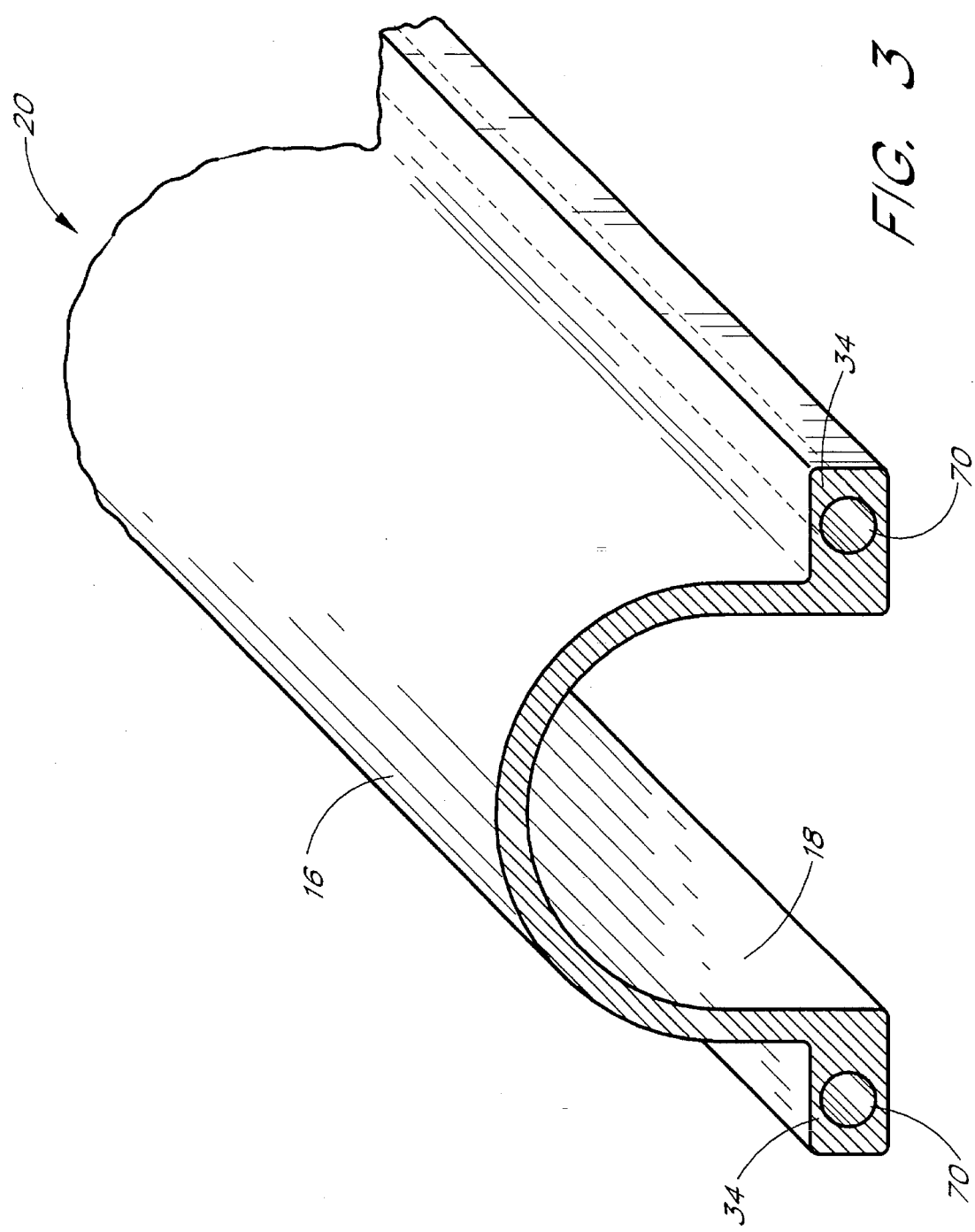
FIG. 3 is a perspective view of a carrier in an alternative embodiment of the present invention.

The transducer 26 and carrier 20 may advantageously be cooled by circulating coolant, as illustrated in FIGS. 1, 2, and 3. Coolant 54 may be introduced into the space or chamber 55 between the diaphragm 36 and the cover 42. This space also includes the interior of the carrier 20. The coolant 54 absorbs heat conducted from the carrier 20. A partition 56 is preferably emplaced between the coolant 54 and the transducer 56 to shield the transducer from exposure to the coolant.

As illustrated in FIG. 2, the coolant 54 may be introduced into the enclosure and circulated by a pump (not shown) connected to a coolant inlet 58. Heated coolant is exhausted through an outlet line 60. The cable 30 is shielded from the coolant 54 by a standpipe 62.

To supplement the cooling action provided by the coolant 54, a cooling gas such as nitrogen may be circulated in the interior of the carrier 20 in the space 64 above the partition 56. In the embodiment of FIGS. 1 and 2, coolant gas is introduced through a line 66 into the space 64 and is exhausted through one or more openings 68 in the partition 56. From the opening 68, the exhaust gas travels through an annulus 69 surrounding the line 66 to an external exhaust port (not shown).

An alternative or supplementary cooling system is illustrated in FIG. 3. In addition to the provision of coolant 54 within the chamber 55, passages 70 may be drilled into the flange portion 34 of the carrier 20. These passages are connected to a source of coolant (not shown) to further assist in dissipating heat conducted by the carrier 20 from the transducer 26.

Figure 4:
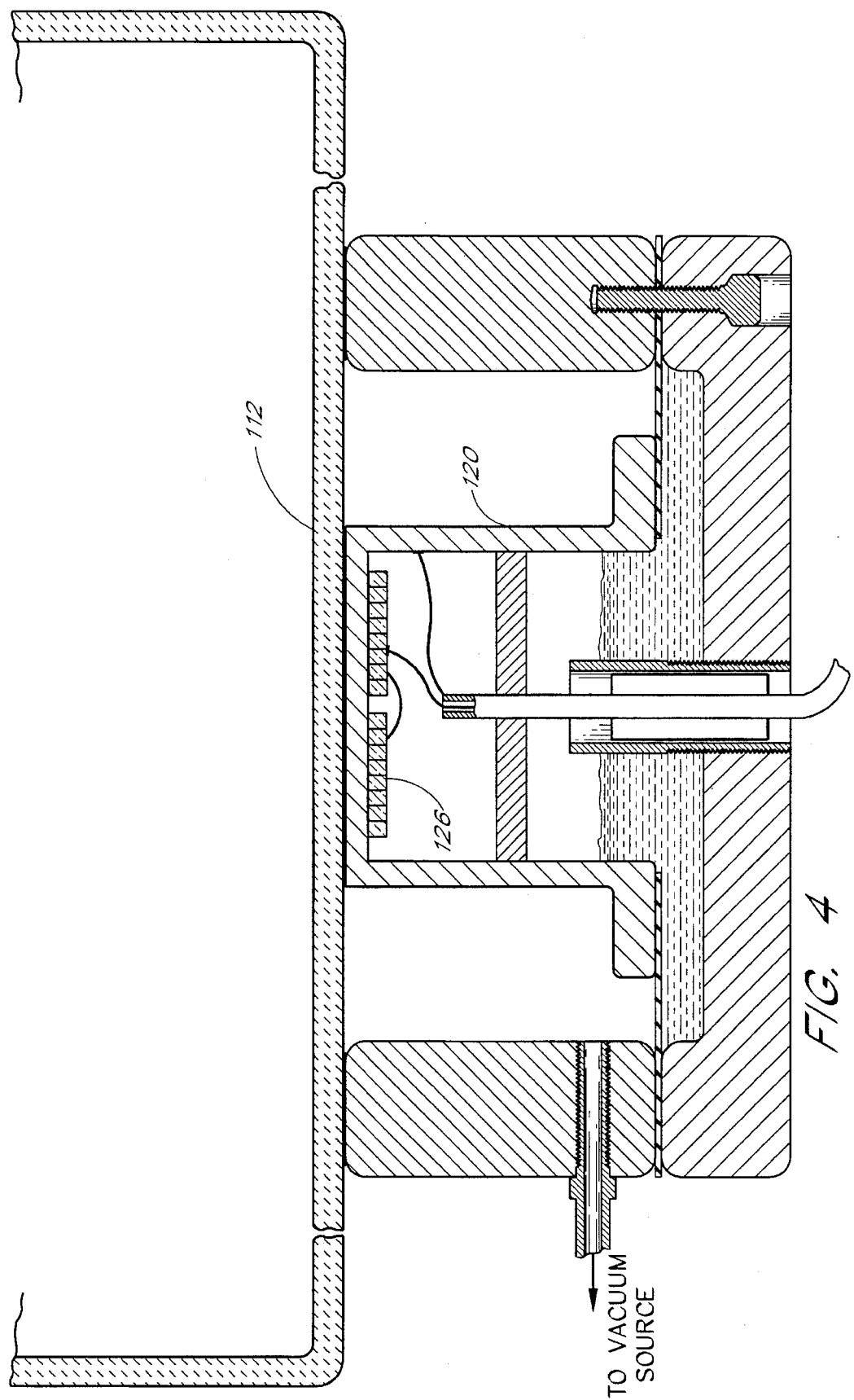
FIGS. 4, 5, 6 and 7 are cross sectional views of alternative embodiments of the megasonic cleaning apparatus of the present invention, in somewhat schematic form.

In the embodiment illustrated in FIGS. 1–3, the carrier 20 has a half-cylindrical shape protruding into the tank 12. This shape provides relatively complete coverage of the tank with megasonic energy, thereby cleaning all of the wafers simultaneously and obviating the need to vary the position of the wafers to cover their entire surfaces. Nevertheless, other shapes can be chosen for the carrier. In the embodiment schematically illustrated in FIG. 4, a carrier 120 has a cross section perpendicular to its long axis, which is rectangular rather than semicircular. This shape mates with a flat surface of the tank 112, and one or more flat transducers 26 are coupled to the carrier 120. This embodiment is comparable to that illustrated in FIGS. 1–3 in other respects. If desired, the carrier 120 may extend over a majority of the tank bottom wall with a large number of flat transducers coupled to the carrier. With large transducers it may be desirable to have some channels in the interface to distribute the vacuum between the carrier and the tank. The transducers 126 may be energized on a cyclic basis by a known system.

The construction and operation of the cleaning apparatus is as follows: First, a tank 12, preferably fashioned out of quartz, is provided with a half-cylindrical shell 14. The support frame 38 is bonded to the lower surface of the tank 12 coextensively with, but spaced outwardly from, the shell 14. The carrier 20 is mounted to the diaphragm 36, and the interface 32 is placed on the convex exterior surface of the carrier 21. The carrier is placed adjoining the shell 14 with the interface 32 engaging the shell 14. The outer portion of the diaphragm 36 is positioned against the frame 38. The cover 42 is then secured to the support frame 38 with the diaphragm periphery clamped between them. The tank, carrier, diaphragm, and frame form the sealed chamber 52 which is evacuated to firmly secure the carrier 20 against the interface 32. Coolant is introduced through the inlet 58 and recirculated through the inlet 58 and the exhaust line 60. At the same time, an inert cooling or purging gas, such as nitrogen, is circulated in the space 64 above the partition 56 through the inlet 66 and the exhaust opening 68 and annulus 69. The transducer 26 is energized by applying radio-frequency electrical energy to the wires 28 so as to transmit megasonic energy through the carrier 20, interface 32, and shell 14 into the tank 12.

The thickness of the portion of the carrier shell 20 which faces the tank shell 14, and the thickness of the tank shell itself should be correlated with the frequency of the megasonic energy applied. This is necessary to obtain good transmission of the megasonic energy from the transducer into the tank. More specifically, the thickness is preferably one-half the wave length of the energy applied or in multiples of one-half of the wave length. In a working prototype of the invention, the megasonic energy applied is approximately 835 kilohertz, and a half wave length of that is about 0.140 inches. The actual specific dimension of the aluminum shell in the prototype was 0.140 inch and for the quartz was 0.142 inch. The actual dimension is not critical, but should be approximately in that area. Conveniently, 0.140 inch thickness for the quartz provides sufficient strength.

While the arrangement illustrated is on the bottom wall of a tank, the carriers 20 or 120 may be mounted to a sidewall of a tank or an angled bottom or sidewall. A vacuum can be applied to draw the carrier toward a tank vertical wall in the same manner as described above in connection with the bottom wall. Conducting coolant through the carrier material or other cooling techniques may be employed.

Although the application of a vacuum is the preferred method of ensuring contact between the carrier 20 and the shell 14, it should be understood that other methods can also be used, particularly if the walls can be made thicker. For example, it is possible to build the carrier 20 and frame 38 so that the lower side of the carrier extends below the bottom of the frame 38. Then, when the diaphragm 36 containing the carrier 20 is mounted to the frame 38, the diaphragm 36 would be placed under tension and induce the carrier 20 to mate with the shell 14 because the carrier would protrude below a line connecting both sides of the diaphragm 36 to the frame 38. This method has the disadvantage that it produces tension on the shell 14, thereby increasing the risk of breakage for the tank bottom, but it still has the advantage that the transducer array is readily removable from the tank.

Figure 5:
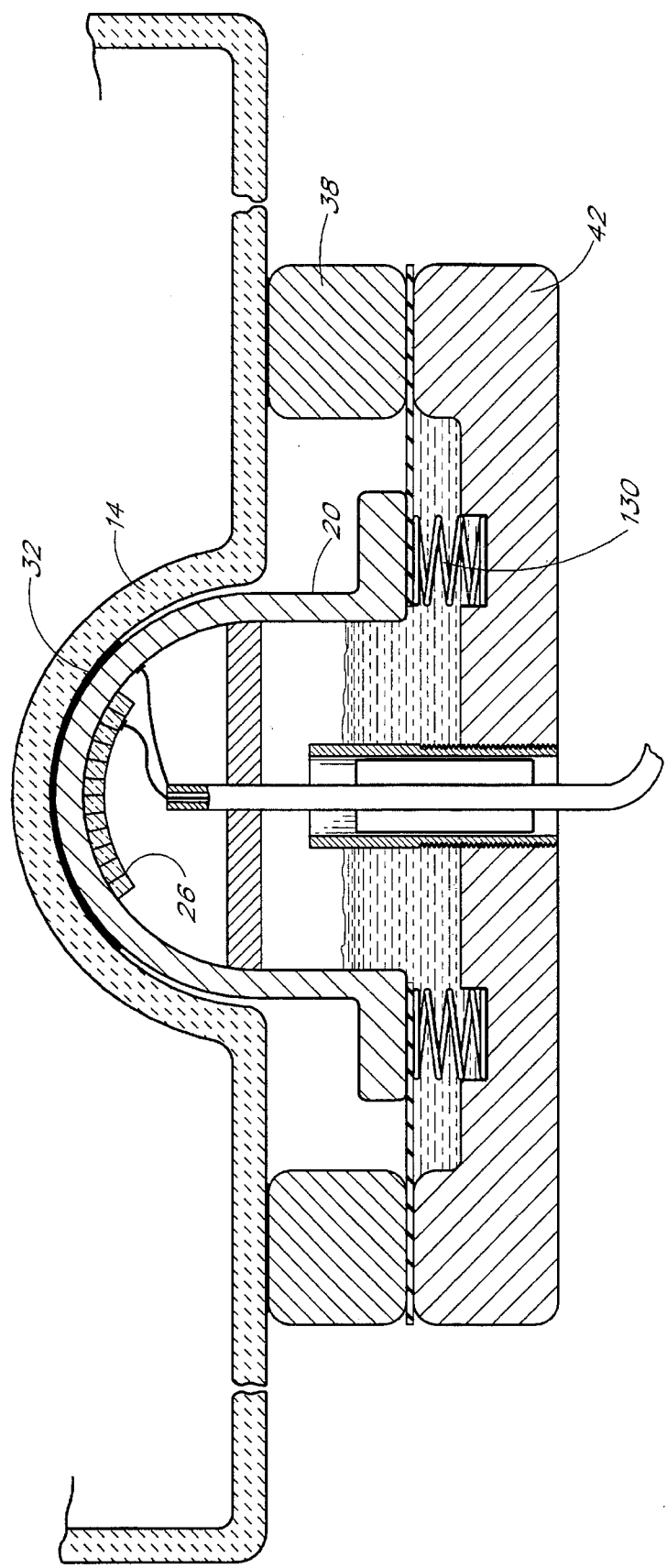
Figure 6:
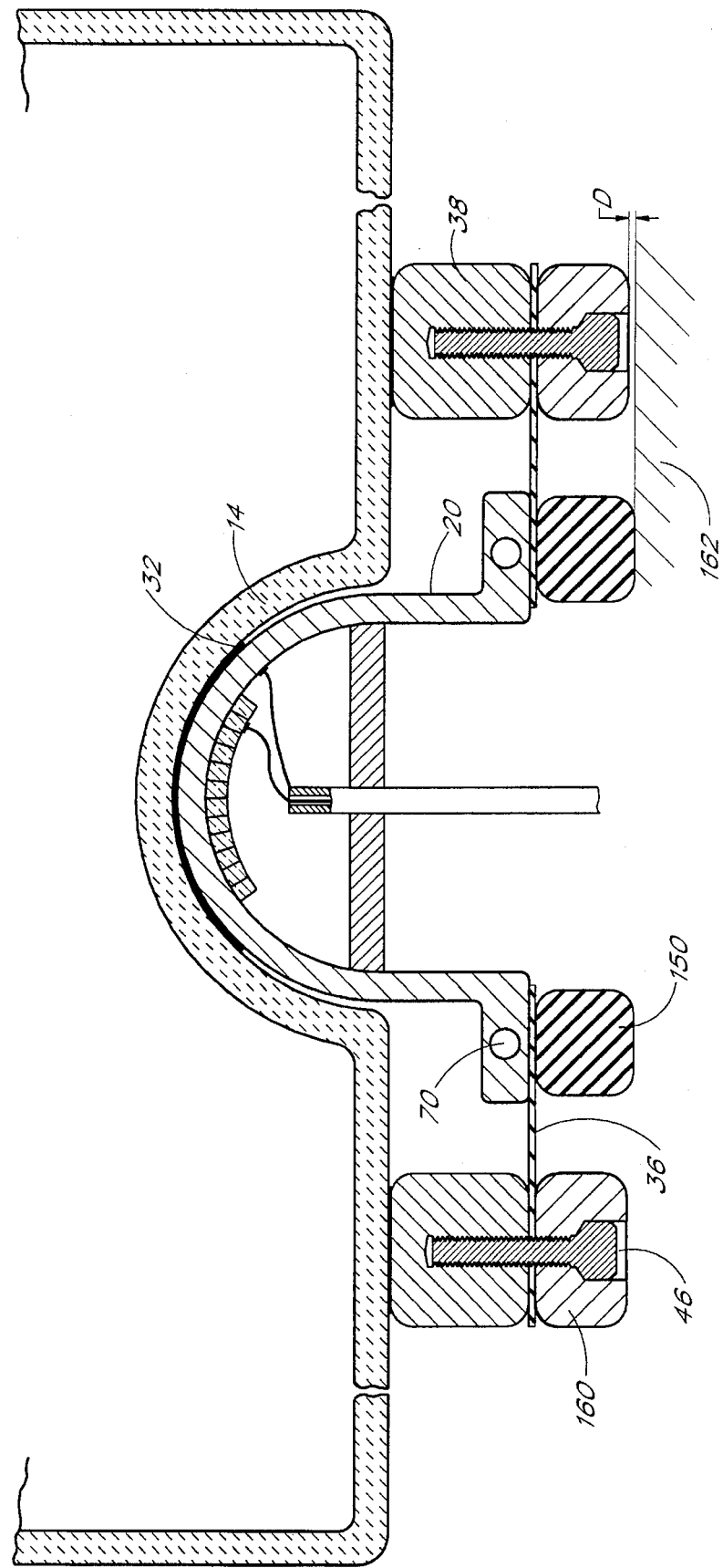
Figure 7:
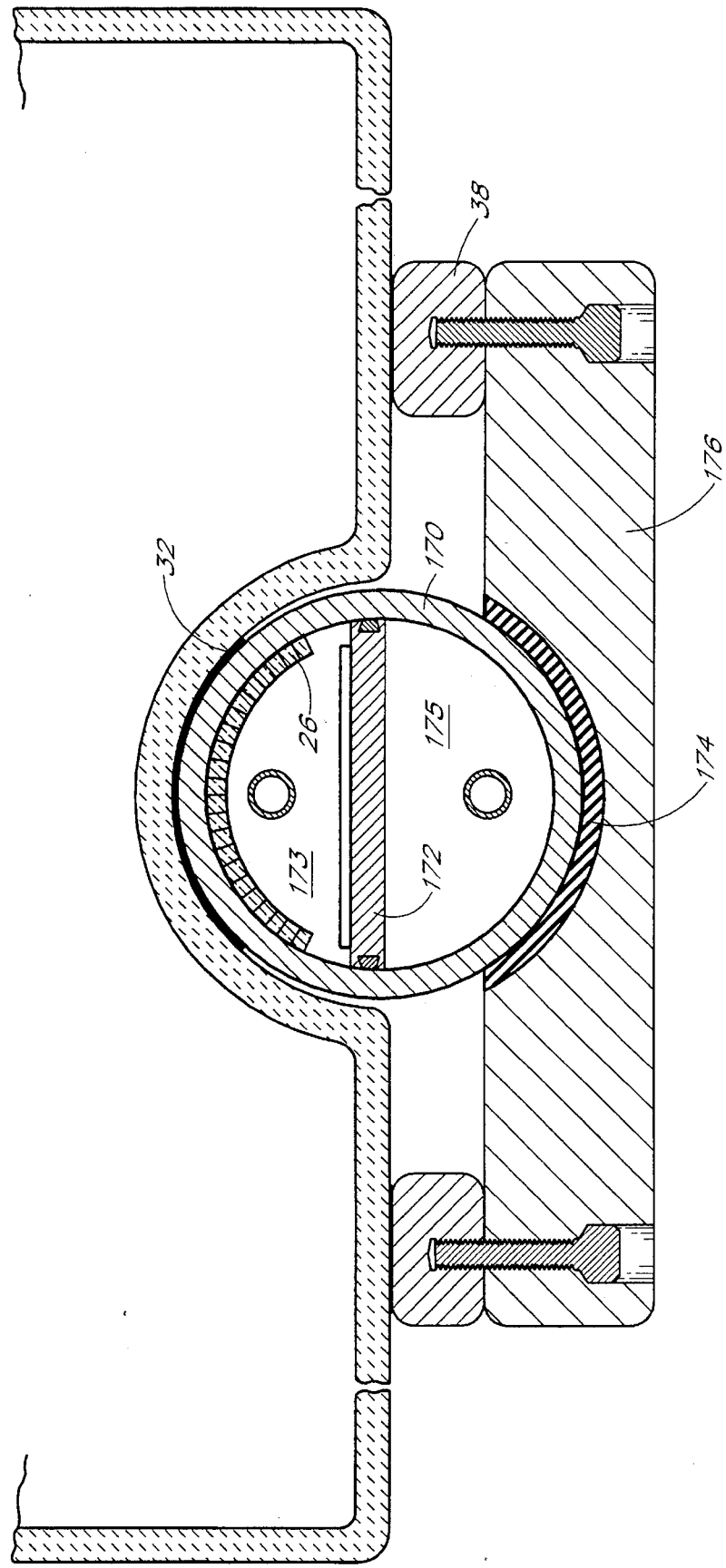

Similarly, FIGS. 5, 6, and 7 schematically illustrate other alternatives of the invention which may be employed if the tank bottom wall is sufficiently sturdy. That in turn may relate to the thickness selected to accomplish the desired megasonic energy transmission. The arrangement of FIG. 5 is essentially like that in FIG. 1 except that elastomeric means in the form of springs 130 extend between the bottom cover 42 and the aluminum carrier 20, with the inner periphery of the diaphragm 36 between the spring and the carrier. The springs are selected to provide the desired force required to hold the carrier in good contact with the interface 32 which is compressed against the tank shell 14. The frame 38 may be permanently bonded to the tank bottom wall while the cover is held in place by suitable bolts 46 (not shown in FIG. 5). No vacuum connection is illustrated inasmuch as the springs provide the desired force. While a vacuum can be employed in addition to the springs if that is desired, that would not normally be done, since the purpose for the springs is to replace the need for the vacuum.

Instead of springs, a compressible elastomeric or other resilient material could be employed. Such an arrangement is illustrated in FIG. 6 wherein a resilient support in the form of a frame 150 is shown positioned beneath the carrier 20. That frame may be bonded or otherwise attached to the lower inner surface of the diaphragm 36 which in turn is attached to the carrier 20. The outer periphery of the diaphragm is bolted between a frame 38 bonded to the tank and a frame cover 160 by suitable bolts 46.

The vertical thickness of the resilient frame is slightly greater than the thickness of the frame cover such that with the tank suspended so that there is no load on the resilient frame 150, its lower surface extends slightly below the lower surface of the frame cover 160. This is illustrated as an amount D in FIG. 6. When the tank is positioned on a table or other support 162, the compressible frame 150 first engages the support 162 causing the frame 150 to press the carrier 20 upwardly against the shell transmitter 14. The resiliency and thickness of the resilient frame 150 is selected to provide the desired compressible force against the interface 32 by the time the lower surface of the cover frame 150 engages the support. At that point, the additional load is transferred to the frame cover 160 and the frame 38 to a larger area of the tank bottom wall 12. In assembly, the tank may be inverted and the transducer assembly positioned against the bottom wall, and the tank then inverted. It should be noted that the diaphragm 36 is basically providing a positioning function for the carrier. Other arrangements can be employed for that purpose. Cooling for the carrier may be provided by the passages 70, as in FIG. 3. Additional cooling may also be provided by forming a coolant chamber in contact with the carrier.

FIG. 7 illustrates another arrangement wherein a transducer assembly is illustrated in the form of aluminum tube 170 with a transducer 26 bonded to the interior of the tube and with a partition 172 extending through the tube so as to form an upper chamber 173 for gas flow and a lower chamber 175 for coolant flow. This type of transducer assembly is further described in allowed U.S. patent application Ser. No. 08/042,889, filed Apr. 5, 1993, which is incorporated herein by reference. That application also illustrates variations of the transducer assembly in FIG. 7.

The aluminum tube 170 is pressed against the interface 32 by means of a compressible elastomeric pad 174 held against the bottom of the aluminum tube by a cover 176, which in turn is bolted to a frame 38 bonded to the bottom of the tank. The thickness and compressibility of the elastomeric material is selected to provide the desired force when the cover plate is clamped in position.

What is claimed is:

1. An apparatus for processing semiconductor wafers comprising:
    a tank having a wall including a portion forming a transmitter of sonic energy;
    a frame mounted to an exterior surface of said tank wall;
    a flexible diaphragm extending across and supported by said frame;
    a transducer carrier supported on the diaphragm with the carrier having a surface held by said diaphragm adjacent to the transmitter; and
    a transducer mounted to an opposite surface of said carrier.

2. The apparatus of claim 1, wherein said carrier includes a peripheral flange attached to the diaphragm.

3. The apparatus of claim 1, comprising an interface sandwiched between said carrier and said transmitter which conforms to the adjacent carrier and transmitter surfaces and conducts energy from the carrier to the transmitter.

4. The apparatus of claim 1, further comprising a cover mounted to said diaphragm and forming a carrier coolant reservoir with the diaphragm.

5. The apparatus of claim 1, wherein said diaphragm, said shell, said tank wall, and said carrier form a chamber to which a vacuum may be applied to draw said carrier to said transmitter.

6. The apparatus of claim 1, wherein the diaphragm is made of an elastomeric material, the tank is made of quartz, and the carrier is made of aluminum.

7. Apparatus for processing semiconductor wafers comprising:
    a quartz tank having a bottom wall including a shell having a convex surface forming an interior surface of the tank and having a concave surface forming an exterior surface of the tank;
    a carrier positioned beneath said shell and having a convex exterior surface positioned in close proximity to the concave surface of the shell, the carrier having a concave downwardly facing surface opposite the carrier convex surface;
    an arcuate transducer having a convex exterior surface which conforms to the concave surface of the carrier and is coupled to the concave surface of the carrier so that sonic energy from the transducer is transmitted to the carrier;
    an interface between the carrier and the shell to conform to the adjacent shell and carrier surfaces and adapted to transmit sonic energy from the carrier to the shell;
    a support frame bonded to an exterior surface of the tank and surrounding and spaced outwardly from portions of the carrier depending below the tank bottom wall; and
    an elastomeric frame-shaped diaphragm attached to a lower surface of the support frame and attached to the depending portions of the carrier to flexibly support the carrier, a chamber being formed that is bounded by an interior wall of the support frame, lower portions of the carrier and the diaphragm, the chamber being pneumatically sealed so that a vacuum may be applied to the chamber to a degree sufficient to draw the carrier upwardly to compress the interface into intimate contact between the carrier and the tank, with said diaphragm being sufficiently flexible to accommodate the upward movement of the carrier.

8. The apparatus of claim 1, including a cover secured to the support frame to clamp the diaphragm between the frame and the cover, and to define a coolant chamber in combination with the carrier and the diaphragm.

9. The apparatus of claim 1, including a coolant inlet and a coolant outlet in the cover and opening to the coolant chamber.

10. The apparatus of claim 9, including a partition extending between sidewalls of the carrier to form a gas chamber between the partition and a portion of the carrier, and a conduit extending through the partition for conducting purge gas into the gas chamber.

11. Apparatus for processing semiconductor wafers comprising:

a flexible diaphragm for mounting to a support, adjacent a processing tank;

a transducer carrier supported on said diaphragm for flexible movement; and a transducer adapted to convert electrical energy into sonic energy, the transducer being coupled to the carrier so that the sonic energy is transmitted to the carrier.

12. The apparatus of claim 11, comprising a support frame, said diaphragm extending across and being mounted to the frame.

13. The apparatus of claim 12, wherein said diaphragm has a central opening, and the carrier extends across the opening.

14. The apparatus of claim 13, comprising a partition mounted on said transducer carrier and creating a chamber enclosing said transducer.

15. The apparatus of claim 11, wherein said carrier has a portion in the shape of a half cylinder.

16. The apparatus of claim 11, wherein said carrier is substantially flat over a portion of its surface.

17. An apparatus for processing semiconductor wafers, comprising:

a tank having a wall including a portion forming a transmitter of sonic energy;

a flexibly mounted transducer carrier having a surface which conforms to and mates with said tank wall portion;

a transducer coupled to a surface of said carrier opposite from said mating surface in a manner to propagate sonic energy into the carrier when the transducer is electrically energized; and an interface layer between the tank wall portion and the carrier mating surface, the interface being conformable to the tank and carrier surfaces which it engages and being capable of transmitting sonic energy from the carrier to the tank wall portion when the interface layer is compressed between the carrier and the tank wall portion, wherein said interface layer is such that the carrier can be readily withdrawn from the tank when the force compressing the interface layer is withdrawn.

18. The apparatus of claim 17, including means for producing the force which compresses the interface layer between the tank and the carrier.

19. An apparatus for processing semiconductor wafers comprising:

a tank having a wall including a portion forming a transmitter of sonic energy;

a transducer carrier having a surface which conforms to and mates with said tank wall portion;

a transducer coupled to a surface of said carrier opposite from said mating surface in a manner to propagate sonic energy into the carrier when the transducer is electrically energized;

an interface layer between the tank wall portion and the carrier mating surface, the interface being conformable to the tank and carrier surfaces which it engages and being capable of transmitting sonic energy from the carrier to the tank wall portion when the interface layer is compressed between the carrier and the tank wall portion, wherein said interface layer is such that the carrier can be readily withdrawn from the tank when the force compressing the interface layer is withdrawn; and means for producing the force which compresses the interface layer between the tank and the carrier, said means including a support for the carrier that enables the carrier to be pressed against the interface layer, or a vacuum applied to a chamber formed by the support, the carrier, and portions of said tank adjacent said carrier, with said chamber being open to the interface layer, and with the chamber being constructed such that when a vacuum is applied to the chamber the vacuum produces a force drawing the carrier towards the tank portion so as to compress the interface layer.

20. The apparatus of claim 19, wherein the carrier is a tube.

21. The apparatus of claim 18, wherein said force producing means includes resilient structures arranged to press the carrier against the interface layer.

22. The apparatus of claim 21, wherein the carrier is positioned to receive a portion of the weight of the tank, and the resilient structure is situated to receive the load applied to the carrier; and said apparatus further includes a support positioned to receive load from the tank and to limit the tank load which is transmitted through the carrier and said resilient structure.

23. The apparatus of claim 17, including one or more springs positioned to press the carrier against the interface layer.

24. The apparatus of claim 17, wherein said carrier includes a tube, and including resilient means compressing the tube against the tank wall portion.

25. A method of transmitting sonic energy into a tank which has a wall portion adapted to efficiently transmit sonic energy comprising:

providing a transducer carrier having a surface which mates with and conforms to an exterior of said tank wall portion;

flexibly mounting the carrier adjacent said wall portion;

coupling a transducer to a surface of the carrier opposite said mating surface in a manner that enables the transducer to propagate megasonic energy into the carrier when the transducer is electrically energized;

positioning an interface layer between the carrier and the tank wall portion, the interface layer being adapted to conform to the mating surfaces of the tank wall portion and the carrier; and compressing the interface layer between the carrier and the tank wall portion, said interface layer being formed of material which will efficiently transmit sonic energy from the carrier to the tank wall portion when the layer is compressed between the carrier and the tank wall portion.

26. A method of transmitting sonic energy into a tank which has a wall portion adapted to efficiently transmit sonic energy comprising:

providing a transducer carrier having a surface which mates with and conforms to an exterior of said tank wall portion;

coupling a transducer to a surface of the carrier opposite said mating surface in a manner that enables the transducer to propagate megasonic energy into the carrier when the transducer is electrically energized;

positioning an interface layer between the carrier and the tank wall portion, the interface layer being adapted to conform to the mating surfaces of the tank wall portion and the carrier; and compressing the interface layer between the carrier and the tank wall portion with a vacuum which produces a force urging the carrier and the tank wall portion towards each other, said interface layer being formed of material which will efficiently transmit sonic energy from the carrier to the tank wall portion when the layer is compressed between the carrier and the tank wall portion.

27. A method of transmitting sonic energy into a tank which has a wall portion adapted to efficiently transmit sonic energy comprising:

providing a transducer carrier having a surface which mates with and conforms to an exterior of said tank wall portion;

coupling a transducer to a surface of the carrier opposite said mating surface in a manner that enables the transducer to propagate megasonic energy into the carrier when the transducer is electrically energized;

positioning an interface layer between the carrier and the tank wall portion, the interface layer being adapted to conform to the mating surfaces of the tank wall portion and the carrier; and compressing said interface layer between the carrier and the tank wall portion with a resilient structure, said interface layer being formed of material which will efficiently transmit sonic energy from the carrier to the tank wall portion when the layer is compressed between the carrier and the tank wall portion.

28. The method of claim 25, wherein said compressing step is accomplished by positioning the carrier and the tank so that the carrier receives a portion of the weight of the tank.

29. The method of claim 28, including limiting the tank load applied to the carrier by means of compressible structure connected to the carrier which compresses to shift tank load to other support structure beyond said weight portion.

30. A method of transmitting sonic energy through a wall of a tank into liquid in the tank to assist in the processing of components submerged in the liquid, comprising:

applying a vacuum to a chamber surrounding a portion of a carrier which has a portion positioned adjacent to a wall of the tank, which is a good transmitter of megasonic energy, the chamber also being formed by the tank wall surrounding the transmitter, a support frame surrounding a portion of the carrier and being attached to said tank wall, and a flexible diaphragm attached to the support frame and having a portion connected to and resiliently supporting the carrier;

applying electrical energy to a transducer sonically coupled to a surface of the carrier to transmit sonic energy through the carrier to the transmitter; and maintaining the vacuum on the chamber when the sonic energy is being applied to the carrier so that the carrier continues to be drawn against the transmitter.

31. The method of claim 30, comprising the step of applying an interface between the carrier and the shell to facilitate the transmission of sonic energy between the transducer, the carrier, and the transmitter.

32. The method of claim 31, comprising the steps of:

securing a cover to said support frame to form a coolant chamber with the frame, the diaphragm, and the carrier; and circulating coolant through said coolant chamber to dissipate heat produced during the operation of said transducer.

33. A method of making an apparatus for applying megasonic energy into a tank containing liquid for processing semiconductor substrates, the method comprising:

providing a tank with a wall including an integral portion forming a good transmitter of sonic energy;

providing a carrier having a surface conforming generally to an exterior surface of said transmitter;

coupling a transducer to a surface of the carrier opposite from said conforming surface to transmit sonic energy from the transducer to the carrier;

mounting the carrier to a flexible diaphragm;

attaching a support frame to an exterior surface of said tank wall surrounding the area in which said transmitter is positioned, with the support frame being spaced from said transmitter;

positioning the carrier adjacent the tank transmitter;

attaching the diaphragm to the support frame so that the carrier is held adjacent the tank transmitter; and drawing the carrier into sonically coupled relation with the transmitter to allow sonic energy to be efficiently transmitted from the transducer through the carrier and through the transmitter into the tank.

34. The method of claim 33, wherein a chamber is formed which surrounds a portion of the carrier that extends out from the tank wall, with the chamber being further bounded by the portion of the tank wall surrounding said transmitter, by the support frame, and by the diaphragm, and including the step of applying a vacuum to the chamber which will draw the carrier toward said transmitter, compressing the interface between the carrier and the transmitter with sufficient force to cause sonic energy to be efficiently transmitted from the transducer, through the carrier, through the interface and through the transmitter.

35. The method of claim 34, including compressing between the carrier and the transmitter a compliant interface that is a good transmitter of sonic energy.

36. An apparatus for processing semiconductor wafers comprising:

a tank having a wall including a portion forming a transmitter of sonic energy;

a transducer carrier removably mounted to said tank adjacent said tank wall portion and having a surface which conforms to and mates with said portion, wherein said carrier can be readily withdrawn from the tank when a force pressing together the carrier and the tank is withdrawn; and a piezoelectric transducer coupled to a surface of said carrier opposite from said mating surface in a manner to propagate sonic energy into the carrier when the transducer is electrically energized.

37. The apparatus of claim 36, including a support for the carrier that enables the carrier to be pressed against the tank.

38. The apparatus of claim 37, including a chamber formed by the support, the carrier, and portions of said tank adjacent said carrier, said chamber being constructed such that when a vacuum is applied to the chamber, the vacuum produces a force drawing the carrier towards the tank portion so as to press them together.

39. A method of transmitting sonic energy into a tank which has a wall portion adapted to efficiently transmit sonic energy comprising:

providing a transducer carrier having a surface which mates with and conforms to an exterior of the tank wall portion;

flexibly and removably mounting the carrier to the tank;

pressing together the carrier and the tank wall portion; and coupling a piezoelectric transducer to a surface of the carrier opposite said mating surface in a manner that enables the transducer to propagate megasonic energy into the carrier when the transducer is electrically energized.

40. The method of claim 39, wherein said pressing includes producing a vacuum force urging the carrier and the tank wall portion towards each other.

41. The method of claim 39, wherein said pressing is produced by a resilient structure.

42. The method of claim 39, wherein said pressing is accomplished by positioning the carrier and the tank so that the carrier receives a portion of the weight of the tank.

43. The method of claim 42, including limiting the tank load applied to the carrier by means of compressible structure connected to the carrier which compresses to shift tank load to other support structure beyond said weight portion.

44. An apparatus for applying megasonic energy into a fluid for cleaning an article, comprising:

a tank;

a frame fixed to a wall of the tank without penetrating the wall;

a frame cover attached to the frame;

a piezoelectric transducer which converts electrical energy into megasonic energy; and a flexible support held in position by said frame and cover, and supporting said transducer in a manner to permit the transducer to be pressed into acoustically coupled relation with a portion of said tank wall outlined by said frame to propagate megasonic energy into the fluid in said tank, said frame cover and said support being readily removable from said frame to enable said transducer to be withdrawn from said tank for repair or replacement.

45. The apparatus of claim 44, including a coolant chamber formed within an area between said tank, frame, and cover for receiving a coolant in heat transfer relation with said transducer.

46. The apparatus of claim 45, including a carrier supported by said flexible support, with said carrier supporting said transducer.

47. The apparatus of claim 46, wherein said carrier is made of a good heat conductive material and is in position to be in heat transfer relation with the coolant.

48. The apparatus of claim 44, including a carrier supported by said flexible support, with said carrier supporting said transducer.

49. The apparatus of claim 44, including an interface layer in contact with said tank wall portion to improve the propagation of said megasonic energy into said tank fluid.

* * * * *

UNITED STATES PATENT AND TRADEMARK OFFICE
CERTIFICATE OF CORRECTION

PATENT NO. : 5,534,076
DATED : July 9, 1996
INVENTOR(S) : Bran

It is certified that error appears in the above-indentified patent and that said Letters Patent is hereby corrected as shown below:

Title page, item [73] Assignee: should read--Verteq--.

Signed and Sealed this

Twenty-second Day of October, 1996

Attest:

BRUCE LEHMAN

*Attesting Officer*  *Commissioner of Patents and Trademarks*